(12) United States Patent
Barkan et al.

(10) Patent No.: US 10,140,491 B1
(45) Date of Patent: Nov. 27, 2018

(54) HANDHELD BARCODE READER WITH MULTIPLE CIRCUIT BOARDS

(71) Applicant: SYMBOL TECHNOLOGIES, LLC, Lincolnshire, IL (US)

(72) Inventors: Edward Barkan, Miller Place, NY (US); Mark Drzymala, Saint James, NY (US)

(73) Assignee: Symbol Technologies, LLC, Holtsville, NY (US)

( * ) Notice: Subject to any disclaimer, the term of this patent is extended or adjusted under 35 U.S.C. 154(b) by 0 days.

(21) Appl. No.: 15/837,863

(22) Filed: Dec. 11, 2017

(51) Int. Cl.
*G06K 7/10* (2006.01)
*H05K 7/02* (2006.01)

(52) U.S. Cl.
CPC ....... *G06K 7/10851* (2013.01); *G06K 7/1098* (2013.01); *G06K 7/10831* (2013.01); *G06K 7/10881* (2013.01); *H05K 7/02* (2013.01)

(58) Field of Classification Search
CPC ............. G06K 7/10851; G06K 7/1098; G06K 7/10881; G06K 7/10831; H05K 7/02
USPC ....................... 235/472.01–472.03
See application file for complete search history.

(56) References Cited

U.S. PATENT DOCUMENTS

| | | | | |
|---|---|---|---|---|
| 7,059,528 | B2* | 6/2006 | Barkan | G06K 7/10613 235/462.01 |
| 7,331,524 | B2* | 2/2008 | Vinogradov | G06K 7/10 235/462.25 |
| 7,823,789 | B2* | 11/2010 | Nunnink | G06K 7/10732 235/462.25 |
| 8,450,708 | B2* | 5/2013 | Liu | G06K 7/10831 235/462.42 |
| 2017/0310856 | A1* | 10/2017 | Handshaw | G03B 11/045 |

* cited by examiner

*Primary Examiner* — Seung H Lee
(74) *Attorney, Agent, or Firm* — Yuri Astvatsaturov

(57) ABSTRACT

Embodiments of the present invention are directed towards barcode readers that implement multiple circuit boards for housing various electronic components. In an embodiment, the present invention is a handheld barcode reader that includes: a handle portion; a head portion positioned on a top of the handle portion; a window positioned within the head portion; a first circuit board extending at least partially through the handle portion, the first circuit board defining a first plane, the first circuit board including a decode assembly; and a second circuit board positioned behind the first plane relative to the window, the second circuit board including an imaging assembly having an imaging sensor, the imaging sensor operable to capture image data over a field of view (FOV), the FOV extending through the first plane and the window.

20 Claims, 5 Drawing Sheets

HANDHELD BARCODE READER WITH MULTIPLE CIRCUIT BOARDS

BACKGROUND

A working range working range of an imaging based barcode reader is limited by several things including image sensor resolution, depth of focus of the optical system, and noise generated within the image sensor. Out of these factors, image sensor resolution can often be a limitation that cannot be easily overcome. This can be particularly prevalent when reading high density barcodes (barcodes with relatively small bars or spaces). The problem stems from the fact that the field of view of the sensor expands as distance from the reader is increased, spreading the pixels across a larger and larger area, reducing the number of pixels available to resolve small features, such as the narrow elements in a high-density barcode. Eventually, the small elements can't be adequately resolved, and the barcode can no longer be decoded.

This situation can be partially resolved by using an imaging sensor with more pixels. However, there are tradeoffs. Specifically, sensors with higher pixel count cost more, often use more power, and make higher demands on the decode microprocessor because there is more data to analyze. Another feature that can help is using optics that provide a field of view that doesn't grow as fast with distance. This results in a slower rate of degradation of resolution as distance increases. The tradeoff with this approach, though, is that the field of view close to the reader can be too small to read common barcodes. This is a problem since users typically hold barcodes relatively close to the reader, and have become accustomed to the reader working when they do so. If the field of view is too small to cover the barcode at the distance at which it is positioned, the reader won't be able to read it and the user may not realize why. To make matters worse, it seems intuitive to many reader operators that if a barcode can't read, it should be moved even closer to the reader, where the user expects the reader should be able to "see" the barcode better. This, however, makes the situation even worse.

Accordingly, there continues to be a need for improved barcode reader designs that allow for both short and long-range operation while maintaining relatively low cost and complexity.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
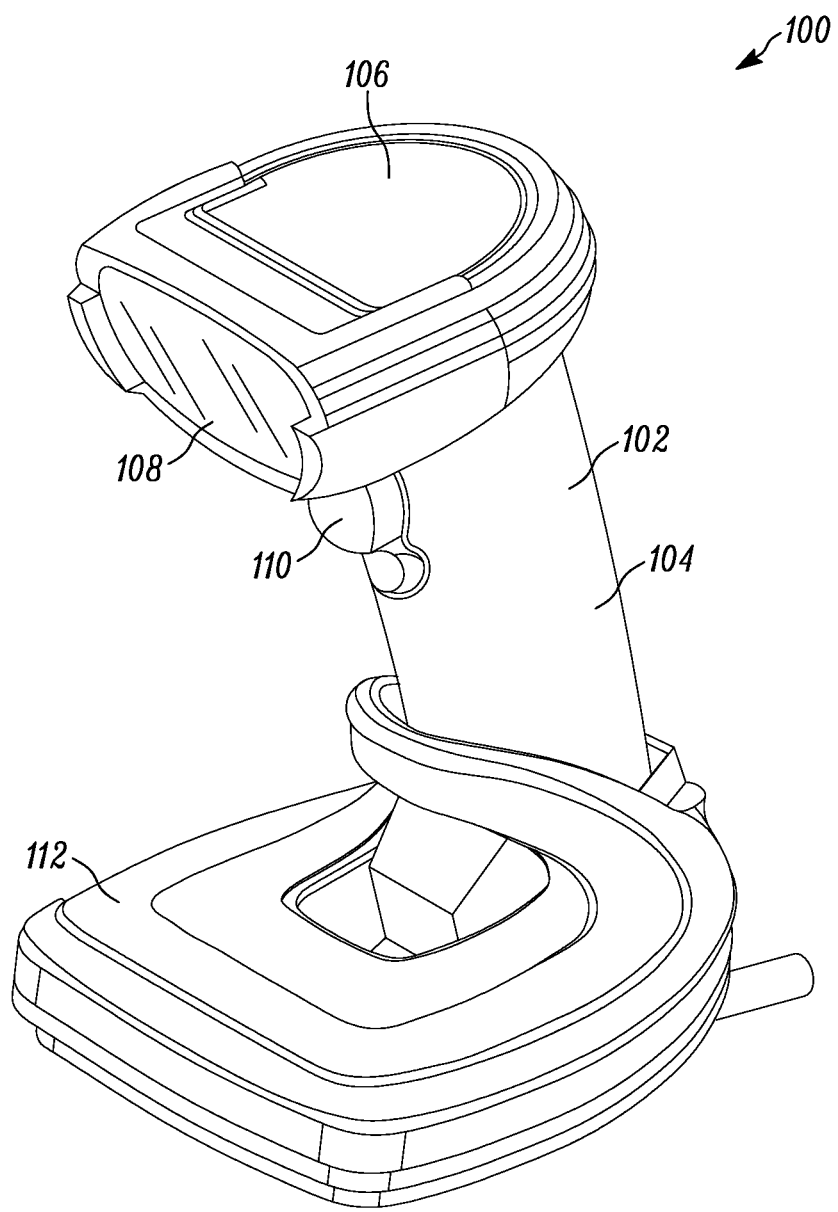
FIG. 1 illustrates a perspective view of a barcode reader according to an embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

In an embodiment, the present invention is a handheld barcode reader that includes: a handle portion; a head portion positioned on a top of the handle portion; a window positioned within the head portion; a first circuit board extending at least partially through the handle portion, the first circuit board defining a first plane, the first circuit board including a decode assembly; and a second circuit board positioned behind the first plane relative to the window, the second circuit board including an imaging assembly having an imaging sensor, the imaging sensor operable to capture image data over a field of view (FOV), the FOV extending through the first plane and the window.

In another embodiment, the present invention is a method of configuring a barcode reader. The method includes: providing a handle portion; providing a head portion; positioning a window within the head portion; positioning a first circuit board at least partially into the handle portion such that the first circuit board extends at least partially through the handle portion, the first circuit board defining a first plane, the first circuit board including a decode assembly; positioning a second circuit board behind the first plane relative to the window, the second circuit board including an imaging assembly having an imaging sensor, the imaging sensor operable to capture image data over a FOV, the FOV extending through the first plane and the window; and positioning the head portion on a top of the handle portion.

Referring now to the drawings, FIG. 1 illustrates an exemplary barcode reader 100 having a housing 102 with a handle portion 104 and a head portion 106. The head portion 106 includes a window 108, and is configured to be positioned on the top of the handle portion 104. The handle portion 104 is configured to be gripped by a reader user (not shown) and includes a trigger 110 for activation by the user. Included in the embodiment is also a base 112 attached to the handle portion 104 opposite the head portion 106. The base 112 is configured to stand on a surface and support the housing 102 in a generally upright position. The barcode reader 100 can be used in a hands-free mode as a stationary workstation when it is placed on the countertop. The barcode reader 100 can also be used in a handheld mode when it is picked up off the countertop and held in an operator's hand. In the hands-free mode, products can be slid, swiped past, or presented to the window 108. In the handheld mode, the barcode reader 100 can be moved towards a barcode on a product, and the trigger 110 can be manually depressed to initiate imaging of the barcode. In some implementations, the base 112 can be omitted, and the housing 102 can also be in other handheld shapes. Other implementations may provide only handheld or only hands-free configurations.

Figure 2:
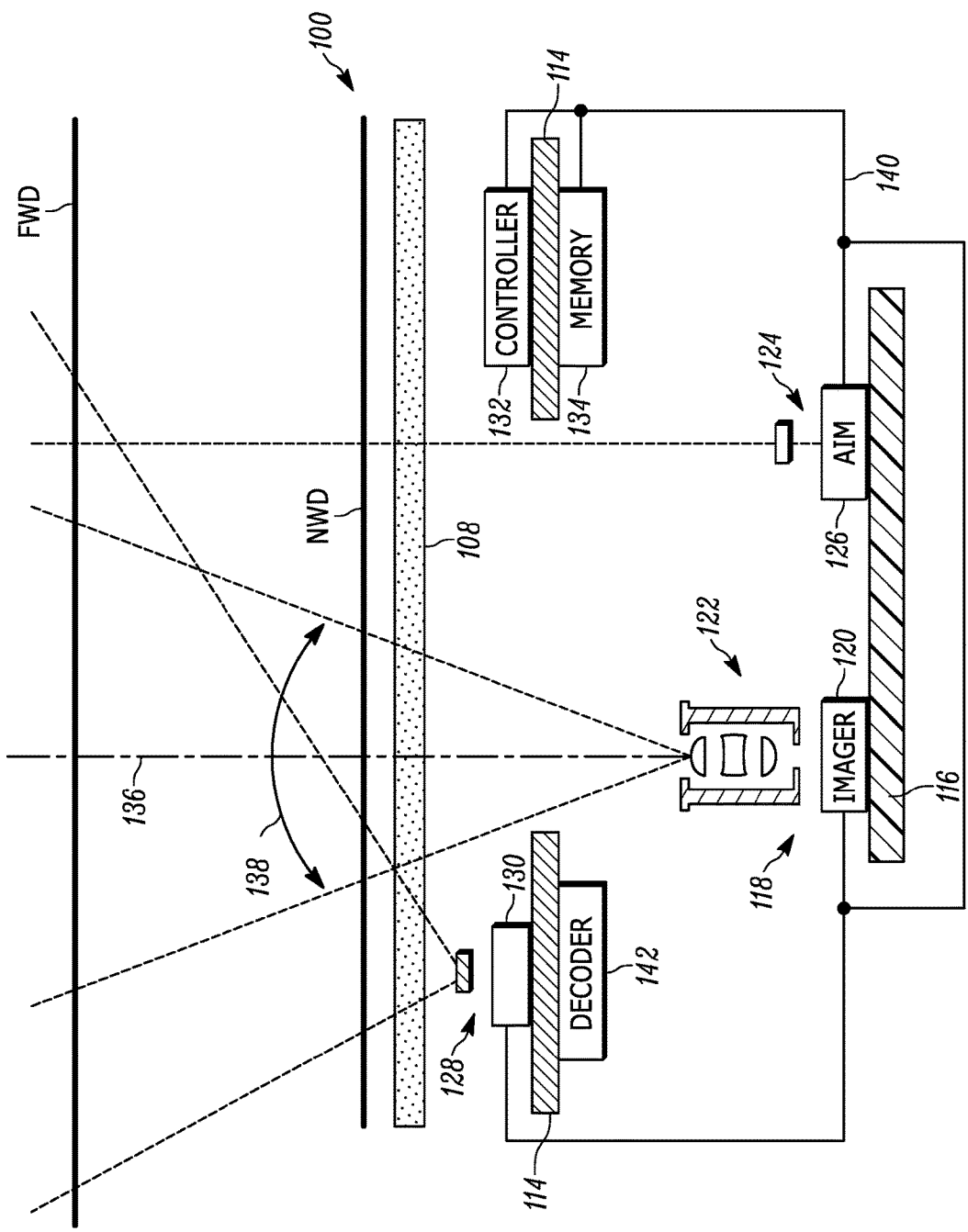
FIG. 2 illustrates a block schematic diagram some of the components of the barcode reader of FIG. 1.

FIG. 2 illustrates a block schematic diagram of a portion of a barcode reader 100 in accordance with some embodiments. It should be understood that FIG. 2 is not drawn to scale. The barcode reader 100 in FIG. 2 includes: (1) a first circuit board 114; (2) a second circuit board 116; (3) an imaging assembly 118 that includes an imaging sensor 120 and an imaging lens assembly 122; (4) an aiming assembly 124 that includes an aiming light source 126; (5) an illumination assembly 128 that includes an illumination light source 130; (6) a controller 132; and (7) a memory 134.

The imaging sensor 120 can be either CCD or CMOS imaging sensors that generally include multiple photosensitive pixel elements aligned in one-dimensional array for linear sensors or two-dimensional array for two-dimensional sensors. The imaging sensor 120 is operative to detect light captured by the imaging lens assembly 118 along an optical path or axis 136 through the window 108. Generally, the image sensor and imaging lens assembly pair is designed to operate together for capturing light scattered, reflected, or emitted from a barcode as pixel data over a one-dimensional or two-dimensional field of view (FOV) 138 that extends between a near working distance (NWD) and a far working distance (FWD). NWD and FWD denote the distances between which the imaging assembly 118 is designed to read barcodes. In some embodiments, the NDW is between approximately 0 and approximately 1 inches from the window 108 and the FWD is between approximately 10 and approximately 60 inches from the window 108. In other examples, these distances may be measured from the nose 158 of the reader.

The imaging sensor is operated by the controller 132, such as a microprocessor, that is communicatively connected thereto. Additionally, the controller 132 is communicatively connected to an aim light source 126, illumination light source 130, and memory 134. Although the link between these components is illustrated as a single communication bus 140, this is merely illustrative, and any communication link between any of the devices may either be dedicated or may include more than the two selected devices. Additionally, placement of components on either side of any of the circuit boards is similarly exemplary. In operation, memory 134 can be accessible by the controller 126 for storing and retrieving data. In some embodiments, the first circuit board 114 also includes a decoder 142 for decoding one or more barcodes that are captured by the imaging sensor 120. The decoder 142 can be implemented within the controller 132 or as a separate module 142.

Figure 3:
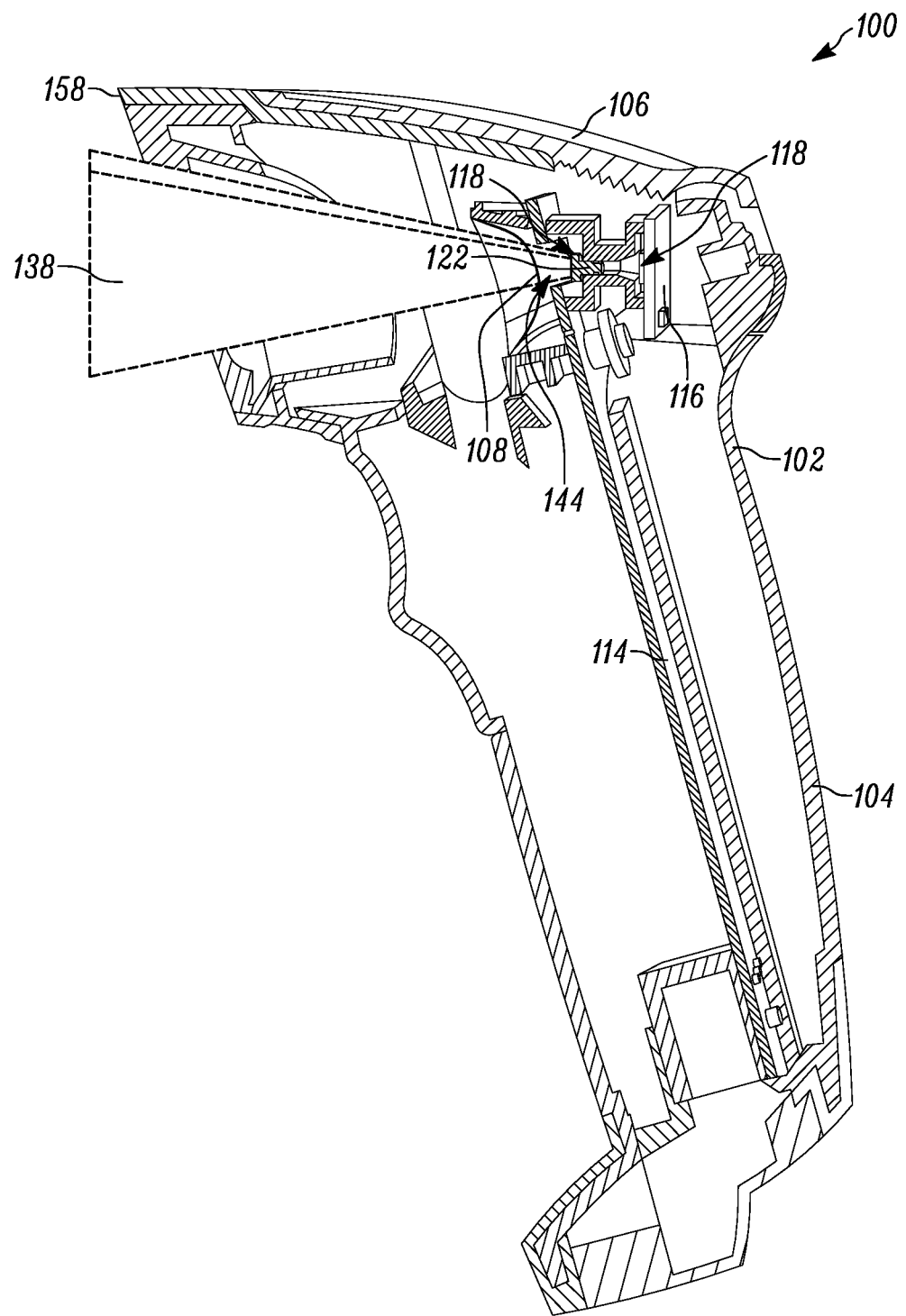
FIG. 3 illustrates a side perspective cut-away view of a barcode reader in accordance with an embodiment of the present invention.
Figure 4:
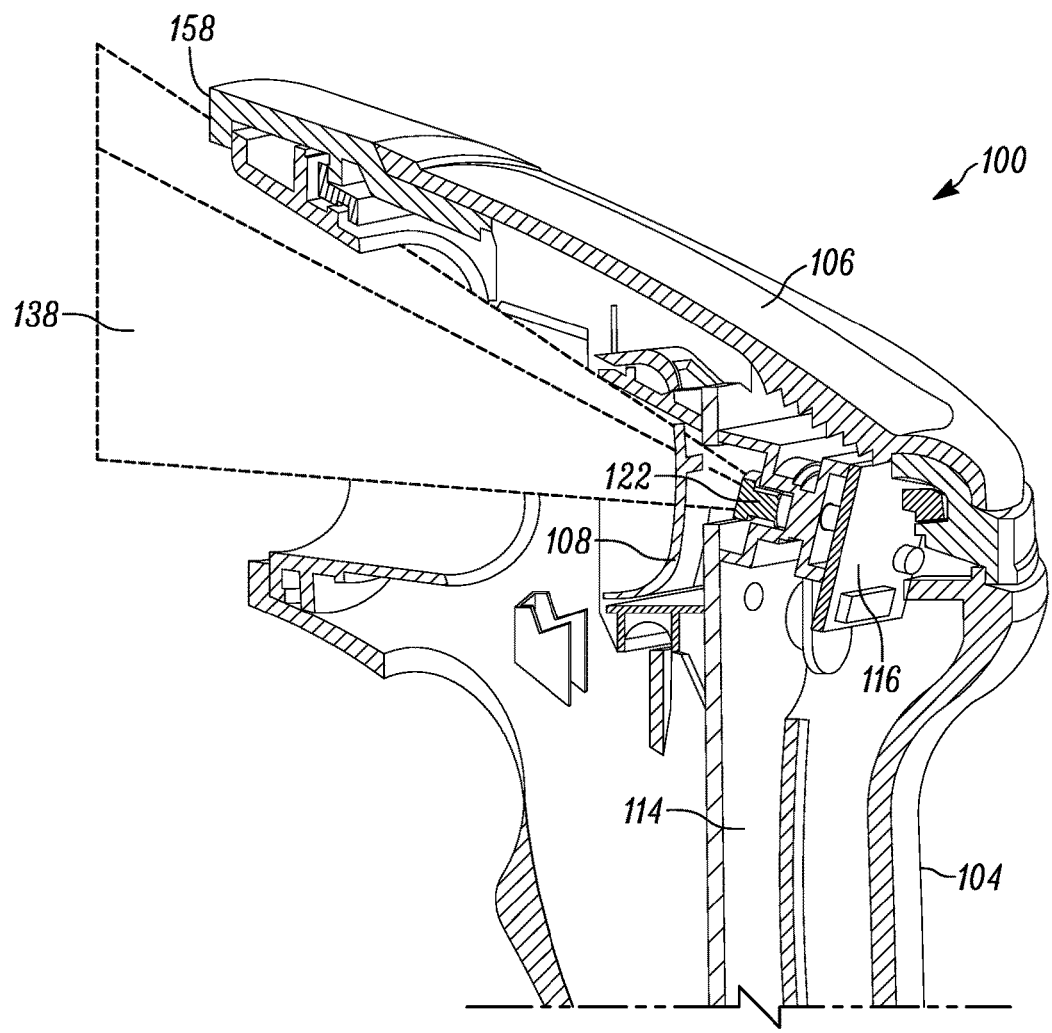
FIG. 4 illustrates a partial rear perspective cut-away view of the barcode reader of FIG. 3.

Referring now to FIGS. 3-4, shown therein is a barcode reader 100 with an exemplary component arrangement. In this arrangement, the reader 100 includes a handle portion 104 that extends in a generally upright direction and a head portion 106 positioned on a top of the handle portion 104. The handle portion 104 and the head portion 106 are generally hollow, allowing for electronic components to be installed therein. In an embodiment, installation can be facilitated by inserting the electronic components downward into the handle portion 104 and thereafter securing the head portion 106 to the top of the handle portion 104. The electronic components can be secured within the handle and/or hear portions via any number of suitable means, including, but not limited to, slide rails, fasteners, stakes, latches, screws, and so on. To reduce and/or eliminate contaminants, and/or protect the equipment inside the reader 100, an exit window 108 is provided in the head portion.

Internally, the electronic components include a first circuit board 114 with a decoder, where the circuit board extends at least partially through the handle portion 104. In the current embodiment, circuit board 114 is a rigid printed circuit board that has a flat shape that can be said to define a first circuit board plane. The electronic components further include a second circuit board 116. In the current embodiment, the second circuit board 116 is positioned behind the first plane of the first circuit board 114 relative to the window 108. The second circuit board 116 includes an imaging assembly 118 that has an imaging sensor 120 and an imaging lens 122. The assembly is configured such that the imaging sensor 120 is operable to capture image data over the FOV 138, where that FOV 138 extending through the first plane of the first circuit board 114 and the window 108.

As can be seen best in FIG. 3, the first circuit board 114 is positioned at an oblique angle relative to the second circuit board 116. In a preferred embodiment, the angle between the first circuit board 114 and the second circuit board 116 is about 15 degrees.

Since, in the shown embodiment, the two circuit boards 114 and 116 are not co-planar, the first circuit board 114 can be designed to extend into the head portion 106 (as shown) such that the FOV 138 passes through a fully enclosed cutout 144 in the first circuit board 114. Though the cutout may be partially enclosed, a configuration with a fully enclosed cutout may be advantageous from a structural point of view as the top portion of the first circuit board 114 may be used to attach various components thereto.

Figure 5:
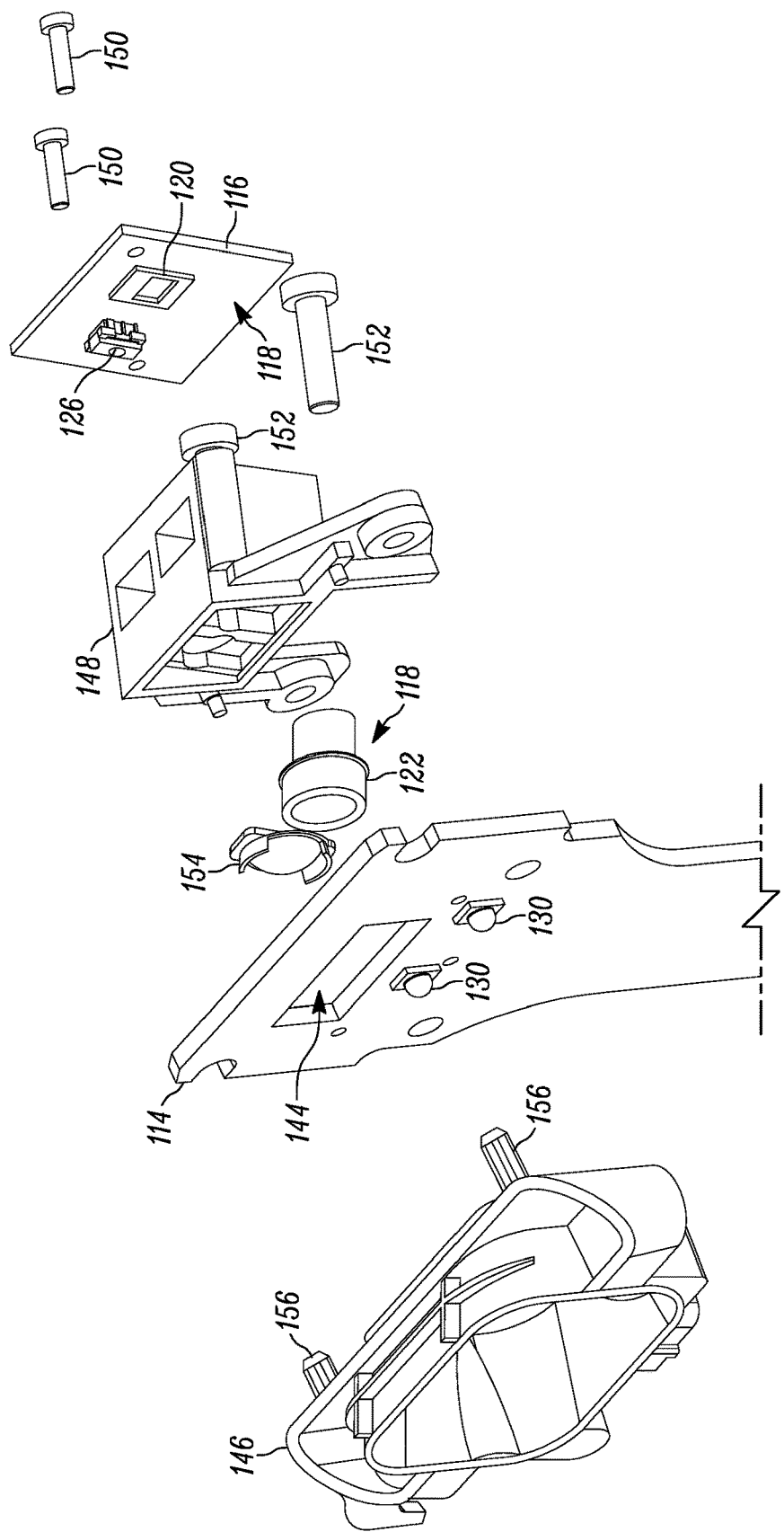
FIG. 5 illustrates an exploded perspective view of some of the components of the reader of FIG. 3.

Referring to FIG. 5 which illustrates an exploded perspective view of some of the components of the reader 100, the top of the first circuit board 114 can be used as a mounting point for the second circuit board 116 and a window bezel 146 that houses the window 108. The second circuit board 116 is fixedly attached to the first circuit board 114 via a chassis member 148 that can act as a spacer and/or an alignment member. In particular, the second circuit board 116 is attached to the back of the chassis member 148 using staking member members 150. In turn, the chassis member 148 is attached to the first circuit board 114 via staking members 152. Staking members 150 and 152 may be press fitted into their respective receiving apertures. Alternatively, other securing methods may be used that include, but are not limited to, using latches, screws, adhesives, alignment pockets, and so on. Included in the chassis member 148 is an imaging lens 122 for providing the desired FOV 138. Additionally, an aiming lens 154 is also installed in the chassis member 148, in front of an aiming light source 126 positioned on the second circuit board 116. On the opposite of the first circuit board 114, the window bezel 146 is fixedly attached thereto using alignment pins 156 configured to fit into respective alignment holes on the circuit board 114. In a preferred embodiment, the window 108 is positioned between the rear end of the window bezel 146 and the front surface of the first circuit board 114.

Using the presently described configuration allows the imaging sensor to be positioned relatively far back in the head portion relative to the window 108 or to the front of the head portion, which may be defined as a plane that is normal to the centroidal axis of the FOV 138 and that intersects the FOV 138 at the most frontal section 158 of the head portion 160. Additionally, this can be achieved via direct sight without the use of mirrors. In some embodiments, the direct distance between the imaging sensor 120 and the window 108 is between 25 and 35 mm. In this case, the width of the FOV 138 at the window is between 20 and 25 mm. Also, in some embodiments, the direct distance between the imaging sensor 120 and a front of the head portion is between 65 and 75 mm. In this case, the width of the FOV at the front of the head portion is between 45 and 50 mm. The aforementioned distances may be measured along the centroidal axis of the FOV 138.

Finally, the first circuit board 114 and the second circuit board 116 are connected via a communication cable (e.g., cable, flexible PCB, etc.) to enable necessary communication between the electronic components on both circuit boards.

In operation in accordance with some embodiments, the controller 132 sends a command signal to energize the illumination source 130 for a predetermined illumination time period. The controller 132 then causes the imaging sensor 120 to activate in an effort to capture an image of a barcode. The captured image(s) are transferred to the controller 132 as pixel data. Such pixel data is digitally processed by the decoder (either in or outside the controller 132) to decode the barcode, if one is present within the FOV 138. The information obtained from decoding the barcode is then stored in the memory 134 and/or sent to other devices for further processing via communication means that are used to connect the reader 100 to the other devices.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

We claim:

1. A handheld barcode reader comprising:
   a handle portion;
   a head portion positioned on a top of the handle portion;
   a window positioned within the head portion;
   a first circuit board extending at least partially through the handle portion, the first circuit board defining a first plane, the first circuit board including a decode assembly; and a second circuit board positioned behind the first plane relative to the window, the second circuit board including an imaging assembly having an imaging sensor, the imaging sensor operable to capture image data over a field of view (FOV), the FOV extending through the first plane and the window.

2. The handheld barcode reader of claim 1, wherein the first circuit board is positioned at an oblique angle relative to the second circuit board.

3. The handheld barcode reader of claim 1, wherein the first circuit board extends into the head portion such that the FOV passes through a partially enclosed cutout in the first circuit board.

4. The handheld barcode reader of claim 1, wherein the first circuit board extends into the head portion such that the FOV passes through a fully enclosed cutout in the first circuit board.

5. The handheld barcode reader of claim 1, wherein the first circuit board is connected to the second circuit board.

6. The handheld barcode reader of claim 5, further comprising a controller operable to control the decode assembly and the imaging assembly.

7. The handheld barcode reader of claim 1, wherein a direct distance between the imaging sensor and a front of the head portion is between 65 mm and 75 mm.

8. The handheld barcode reader of claim 7, wherein a width of the FOV at the front of the head portion is between 45 mm and 50 mm.

9. The handheld barcode reader of claim 1, wherein a direct distance between the imaging sensor and the window is between 25 mm and 35 mm.

10. The handheld barcode reader of claim 9, wherein a width of the FOV at the window is between 20 mm and 25 mm.

11. The handheld barcode reader of claim 1, wherein the second circuit board includes an aiming assembly having at least one aiming light source.

12. The handheld barcode reader of claim 11, wherein the first circuit board includes an illumination assembly having at least one illumination light source.

13. The handheld barcode reader of claim 1, wherein the second circuit board is attached to the first circuit board via a chassis member.

14. A method of configuring a barcode reader, the method comprising:
    providing a handle portion;
    providing a head portion;
    positioning a window within the head portion;
    positioning a first circuit board at least partially into the handle portion such that the first circuit board extends at least partially through the handle portion, the first circuit board defining a first plane, the first circuit board including a decode assembly;
    positioning a second circuit board behind the first plane relative to the window, the second circuit board including an imaging assembly having an imaging sensor, the imaging sensor operable to capture image data over a field of view (FOV), the FOV extending through the first plane and the window; and
    positioning the head portion on a top of the handle portion.

15. The method of claim 14, wherein the first circuit board is positioned at an oblique angle relative to the second circuit board.

16. The method of claim 14, wherein the first circuit board extends into the head portion such that the FOV passes through one of a fully enclosed or a partially enclosed cutout in the first circuit board.

17. The method of claim 14, wherein the second circuit board is attached to the first circuit board via a chassis member.

18. The method of claim 14, wherein a direct distance between the imaging sensor and a front of the head portion is between 65 mm and 75 mm.

19. The method of claim 18, wherein a width of the FOV at the front of the head portion is between 45 mm and 50 mm.

20. The method of claim 14, wherein a direct distance between the imaging sensor and the window is between 25 mm and 35 mm.

* * * * *